(12) United States Patent
Shotey et al.

(10) Patent No.: US 8,963,001 B2
(45) Date of Patent: Feb. 24, 2015

(54) COLLAPSIBLE IN-USE COVER

(71) Applicant: Hubbell Incorporated, Shelton, CT (US)

(72) Inventors: Marcus J. Shotey, Scottsdale, AZ (US);
Jeffrey P. Baldwin, Phoenix, AZ (US);
Kenneth C. Booth, Mesa, AZ (US);
Miguel Chapa, Gilbert, AZ (US);
Bradley Fulghum, Gilbert, AZ (US)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 14/052,237

(22) Filed: Oct. 11, 2013

(65) Prior Publication Data

US 2014/0110144 A1     Apr. 24, 2014

Related U.S. Application Data

(60) Division of application No. 13/291,979, filed on Nov. 8, 2011, now Pat. No. 8,592,682, which is a division of application No. 12/173,758, filed on Jul. 15, 2008, now Pat. No. 8,053,671, which is a (Continued)

(51) Int. Cl.
*H02G 3/14* (2006.01)
*H02G 3/08* (2006.01)
*H05K 5/03* (2006.01)

(52) U.S. Cl.
CPC ............... *H02G 3/088* (2013.01); *H02G 3/14* (2013.01); *H05K 5/03* (2013.01)
USPC ............ 174/67; 174/66; 174/481; 174/57; 220/3.2; 220/241; 220/242

(58) Field of Classification Search
CPC ......... H02G 3/14; H02G 3/088; H02G 3/081; H02G 3/083; H02G 3/08; H01R 13/74; H01R 13/5213; H05K 5/03; H05K 5/00; H05K 5/02
USPC ........... 174/480, 481, 50, 53, 57, 58, 66, 559, 174/67; 220/3.2–3.9, 4.02, 241, 242; 248/906; 439/535, 536; D8/353; D13/177; 200/333
See application file for complete search history.

(56) References Cited

U.S. PATENT DOCUMENTS

| | | | |
|---|---|---|---|
| 2,458,153 A | | 1/1949 | Festge |
| 2,916,733 A | | 12/1959 | Hirsch |
| 3,449,706 A | * | 6/1969 | Carissimi ........................ 174/67 |
| 4,634,015 A | * | 1/1987 | Taylor ............................ 220/3.7 |

(Continued)

*Primary Examiner* — Angel R Estrada
(74) *Attorney, Agent, or Firm* — Roylance, Abrams, Berdo & Goodman, L.L.P.

(57) ABSTRACT

An electrical device cover assembly configured for mounting over an electrical device is described. The electrical device cover assembly comprises a base comprising an opening large enough to receive an electrical device. A lid comprising a lid face, a lid ring, and an expansion section between the lid face and the lid ring, the lid coupled to the base and comprising an inside surface and an expansion section, the expansion section expandable from a first depth to a second depth at least twice as deep as the first depth is provided. An expansion arm moveable between a first collapsed position when the expansion section is at its first depth and an second expanded position when the expansion section is at its second depth, wherein in the second position the expansion arm is in contact with and supports the lid at its second depth is also provided.

9 Claims, 20 Drawing Sheets

Related U.S. Application Data continuation-in-part of application No. 11/780,839, filed on Jul. 20, 2007, now Pat. No. 7,619,163, which is a continuation-in-part of application No. 11/557,580, filed on Nov. 8, 2006, now Pat. No. 7,381,894, said application No. 12/173,758 is a continuation-in-part of application No. 12/169,058, filed on Jul. 8, 2008, now Pat. No. 7,554,037.

(60) Provisional application No. 60/950,661, filed on Jul. 19, 2007, provisional application No. 60/825,254, filed on Sep. 11, 2006.

(56) References Cited

U.S. PATENT DOCUMENTS

| | | |
|---|---|---|
| 4,803,307 A | 2/1989 | Shotey |
| 4,988,832 A * | 1/1991 | Shotey .......................... 174/67 |
| 5,042,673 A * | 8/1991 | McShane .................... 174/57 |
| 5,527,993 A | 6/1996 | Shotey et al. |
| 5,562,222 A | 10/1996 | Jordan et al. |
| 5,763,831 A | 6/1998 | Shotey et al. |
| 6,133,531 A | 10/2000 | Hayduke et al. |
| 6,441,307 B1 | 8/2002 | Shotey et al. |
| 6,476,321 B1 | 11/2002 | Shotey et al. |
| 6,723,922 B1 | 4/2004 | Shotey et al. |
| 6,737,576 B1 * | 5/2004 | Dinh ............................. 174/57 |
| 6,761,582 B1 | 7/2004 | Shotey et al. |
| 6,770,816 B2 | 8/2004 | Shotey et al. |
| 6,894,223 B1 | 5/2005 | Shotey et al. |
| 6,979,777 B2 | 12/2005 | Marcou et al. |
| 6,987,225 B2 | 1/2006 | Shotey et al. |
| 7,038,131 B1 * | 5/2006 | Gretz ............................. 174/58 |
| 7,109,419 B1 | 9/2006 | Gretz |
| 7,259,328 B1 * | 8/2007 | Gretz ............................. 174/57 |
| 7,396,996 B1 | 7/2008 | Shotey et al. |
| 7,554,037 B1 | 6/2009 | Shotey et al. |
| 7,598,454 B1 | 10/2009 | Baldwin et al. |
| 7,619,163 B1 | 11/2009 | Shotey et al. |
| 8,053,671 B1 | 11/2011 | Shotey et al. |
| 2005/0197019 A1 | 9/2005 | Shotey et al. |

\* cited by examiner

COLLAPSIBLE IN-USE COVER

CROSS REFERENCE TO RELATED APPLICATIONS

This application is a division of U.S. patent application Ser. No. 13/291,979, which is a division of U.S. patent application Ser. No. 12/173,758, filed on Nov. 8, 2011, to Shotey et al. entitled "Collapsible In-Use Cover," filed on Jul. 15, 2008, now U.S. Pat. No. 8,053,671, which application claims the benefit of the filing date of U.S. Provisional Patent Application 60/950,661 to Shotey, et al. entitled "Collapsible In-Use Cover," which was filed on Jul. 19, 2007, the disclosure of which is hereby incorporated herein by reference.

The earlier U.S. patent application Ser. No. 12/173,758 is also a continuation-in-part application of the earlier U.S. Utility patent application to Shotey et al. entitled "Electrical Device Cover," application Ser. No. 11/780,839, filed Jul. 20, 2007, now U.S. Pat. No. 7,619,163, which application is a continuation-in-part application of the earlier U.S. Utility patent application to Shotey et al. entitled "Electrical Device Cover," application Ser. No. 11/557,580, filed Nov. 8, 2006, now U.S. Pat. No. 7,381,894, which claimed the benefit of the filing date of U.S. Provisional Patent Application 60/734,858, entitled "Flexible Outlet Cover" to Baldwin which was filed on Nov. 8, 2005, and the benefit of the filing date of U.S. Provisional Patent Application 60/825,254, entitled "Collapsible In-Use Cover" to Shotey et al. which was filed on Sep. 11, 2006, the contents of all of which are hereby incorporated herein by reference.

The earlier U.S. patent application Ser. No. 12/173,758 is also a continuation-in-part application of the earlier U.S. Utility patent application to Shotey et al. entitled "Expandable In-Use Outlet Cover," application Ser. No. 12/169,058, filed Jul. 8, 2008, now U.S. Pat. No. 7,554,037, the disclosure of which is hereby incorporated herein by reference.

BACKGROUND

1. Technical Field

Aspects of this document relate generally to covers for electrical devices.

2. Background Art

Electrical devices are prone to exposure to water and other contaminants when mounted in locations such as exterior walls. Many different cover designs seek to shield the devices from weather-related contaminants while electrical connectors are coupled with the devices. These cover designs are generally called "while-in-use" covers. Examples of typical electrical devices include receptacles, switches, and communication ports. Typical while-in-use cover designs include a base connected to a lid by a hinge.

One specific known example of a telescoping while-in-use cover is disclosed in U.S. Pat. No. 7,038,131 to Gretz. In use, however, the weight of a cord extending through the cord ports tends to collapse a side of the cover, potentially exposing a gap through which water may pass.

SUMMARY

Aspects of this document relate to electrical device covers.

In one aspect, an electrical device cover assembly configured for mounting over an electrical device comprises a base comprising an opening large enough to receive an electrical device. The electrical device cover assembly further comprises a lid comprising a lid face, a lid ring, and an expansion section between the lid face and the lid ring. The lid is coupled to the base and comprises an inside surface and an expansion section, the expansion section expandable from a first depth to a second depth at least twice as deep as the first depth. The electrical device cover assembly also comprises an expansion arm moveable between a first collapsed position when the expansion section is at its first depth and an second expanded position when the expansion section is at its second depth, wherein in the second position the expansion arm is in contact with and supports the lid at its second depth.

Particular implementations may include one or more of the following. The expansion arm may pivot between the first position and the second position. The expansion arm may be movably coupled to the lid ring. The expansion arm may extend from the lid ring to the lid face when the expansion arm is in its second position. The expansion arm may pivot between the first position and the second position to extend from the lid ring to the lid face. The expansion arm may pivot between the first position and the second position to extend from the lid face to the lid ring. The expansion arm may be movably coupled to the lid face. The expansion arm may be movably coupled to the base. The expansion arm may extend from the base to the lid face when the expansion arm is in its second position. The expansion arm may pivot between a first position and a second position to extend from the base to the lid. The expansion arm may comprise a levered pin. The expansion section may comprise a pleated expandable boot. The expansion section may comprise one or more telescoping sections. The pivoting arm may comprise a bias mechanism biasing the pivoting arm into the second position.

In another aspect, an electrical device cover assembly configured for mounting over an electrical device comprises a base; a lid comprising a lid face, a lid ring, one or more eyelets, and an expansion section, the expansion section expandable to a plurality of incremental expansion points; and one or more levered pins coupled with the cover assembly, the one or more levered pins engageable with the one or more eyelets to support the lid at a plurality of incremental expansion points with respect to the lid ring.

Particular implementations may include one or more of the following. The one or more levered pins may be movably coupled to the lid face. The one or more levered pins may be movably coupled to the lid ring.

In still another aspect, an electrical device cover assembly configured for mounting over an electrical device comprises a base comprising an opening large enough to receive an electrical device; a lid comprising a lid ring and a lid face moveably coupled to the lid ring and expandable from a collapsed position having a first depth to an expanded position having a second depth deeper than the first depth; and one or more wiper gaskets coupled to the lid and extending between the lid ring and the lid face, the one or more wiper gaskets maintaining sliding contact between the lid ring and the lid face when the lid is moved from its collapsed position to its expanded position, the one or more wiper gaskets configured to resist water entry between the lid ring and the lid face.

Particular implementations may include one or more of the following. The one or more wiper gaskets may be coupled to the lid ring. The one or more wiper gaskets may comprise a wiper blade extending toward and in contact with the lid face when the lid is moved from its collapsed position to its expanded position.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

A collapsible in-use cover will hereinafter be described in conjunction with the appended drawings, where like designations denote like elements, and.

DESCRIPTION

This disclosure, its aspects and implementations, are not limited to the specific components or assembly procedures disclosed herein. Many additional components and assembly procedures known in the art consistent with the intended electrical device cover and/or assembly procedures for an electrical device cover will become apparent for use with implementations of electrical device covers from this disclosure. Accordingly, for example, although particular cover assemblies, bases, lids, expansion sections, pivoting arms, detenting mechanisms, bias mechanisms, incremental expansion points, levered pins, eyelets, expansion arms, and expansion arm stops are disclosed, such cover assemblies, bases, lids and expansion sections and implementing components may comprise any shape, size, style, type, model, version, measurement, concentration, material, quantity, and/or the like as is known in the art for such cover assemblies, bases, lids and expansion sections and implementing components, consistent with the intended operation of an electrical device cover.

Figure 1:
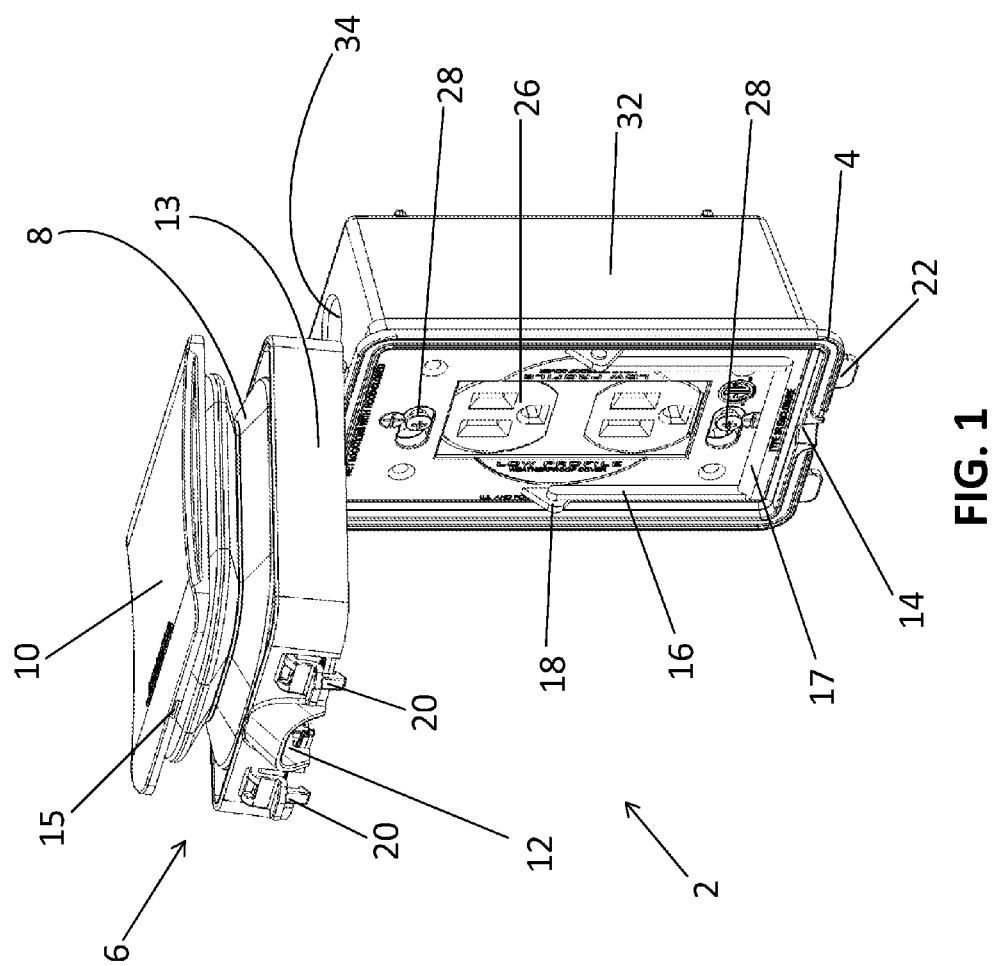
FIG. 1 is a perspective view of a first implementation of an electrical device cover assembly in an open, partially expanded position.
Figure 2:
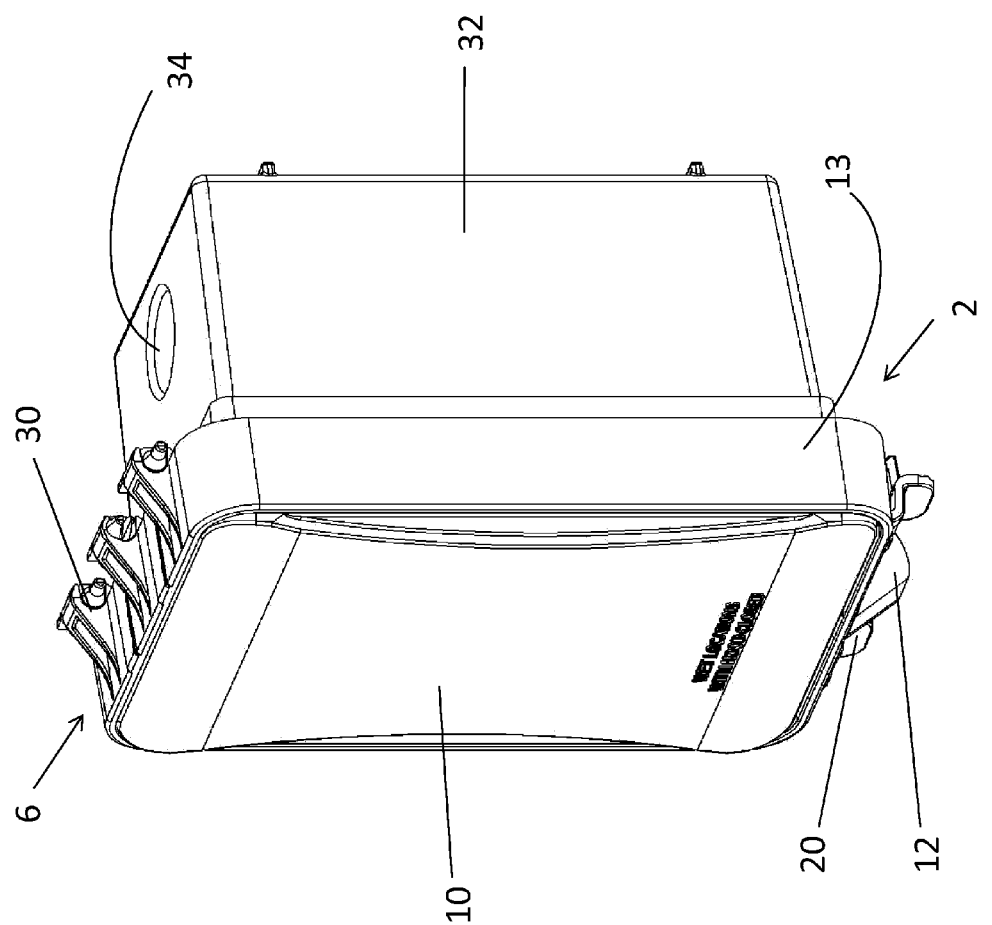
FIG. 2 is a perspective view of the electrical device cover assembly of FIG. 1 in a closed, collapsed position.

FIGS. 1 and 2 illustrate a first implementation of an electrical device cover assembly 2. The electrical device cover assembly 2 comprises base 4 and lid 6 (which comprises lid ring 13 and lid face 10). In particular implementations, base 4 comprises expansion arm 16, which may be coupled with base 4 via pivoting arm mount 18. In some particular implementations, expansion arm 16 may comprise any lever, prop, or other device capable of maintaining a lid in an expanded position with respect to a base. In other particular implementations, expansion arm 16 may be movably coupled with lid face 10. In still other implementations, expansion arm 16 may be movably coupled with lid ring 13. In all of the implementations described in this document, excepting the implementation illustrated in FIGS. 10-13, an expansion arm is moveable at least between a first collapsed position (where a lid face is collapsed with respect to a lid ring), and a second expanded position (where a lid face is collapsed with respect to a lid ring). Base 4 comprises one or more electrical device openings 24 sized and/or configured to receive therethrough one or more electrical devices. In addition, base 4 may comprise one or more box mounting screw apertures 28, which allow base 4 to be removably coupled with an electrical device 26 and/or electrical device box 32 via one or more box mounting screws (not shown). Base 4 may further comprise one or more tabs 22 or latches which are configured to removably couple with one or more lid clasps 20 on the lid 6. Base 4 further comprises base cord port 14, which allows an electrical device cord to pass therethrough when the electrical device is in use and the lid 6 is closed (or partially closed) with respect to base 4.

Still referring to FIGS. 1 and 2, base 4 is coupled with lid 6 via one or more lid hinge elements 30. In particular, lid 6 comprises lid ring 13, which is coupled with base 4 via one or more lid hinge elements 30. Lid ring 13 comprises one or more lid clasps 20, which engage the one or more tabs comprising base 4 in order to provide a removably locking fit between base 4 and lid 6. Lid ring 13 further comprises lid cord port 14, which allows an electrical device cord to pass therethrough when the electrical device is in use and the lid 6 is closed (or partially closed) with respect to base 4. Lid ring 13 is coupled with lid 10 via expansion section 8. In particular implementations, expansion section 8 may comprise a pleated expandable boot configured to resist entry of rain water or other weather elements and is expandable to a plurality of expanded or partially expanded positions. In other particular implementations, expansion section 8 may comprise two or more telescoping sections that extend to one or more in-use positions when it is desired to use the outlet while the cover is closed, and retract to a storage position when there is no need to have the cover closed with a plug inserted, as disclosed in co-pending application Ser. No. 11/422,583 to Shotey, et al., which is incorporated herein by reference. A comparison of FIG. 1 to FIG. 2 shows that the expansion section 8 in FIG. 1 is in a partially expanded position while the expansion section 8 in FIG. 2 is in a fully collapsed position, described more fully with respect to FIGS. 3 and 4. In any of the foregoing implementations, lid face 10 may comprise one or more lower snap tabs 15, which are configured to removably snap lid face 10 in place with respect to lid ring 13. Lid face 10 further comprises an inside surface (inside surface 38, FIGS. 3 and 4), and an outside surface. In particular implementations, lid face 10 may comprise a flexible membrane, as described in U.S. Pat. No. 7,381,984 to Shotey et al., which is incorporated herein by reference. In addition, in all of the implementations described in this document, excepting the implementation shown in FIGS. 10-13, expansion section 8 extends from a lid ring to a lid face.

Figure 3:
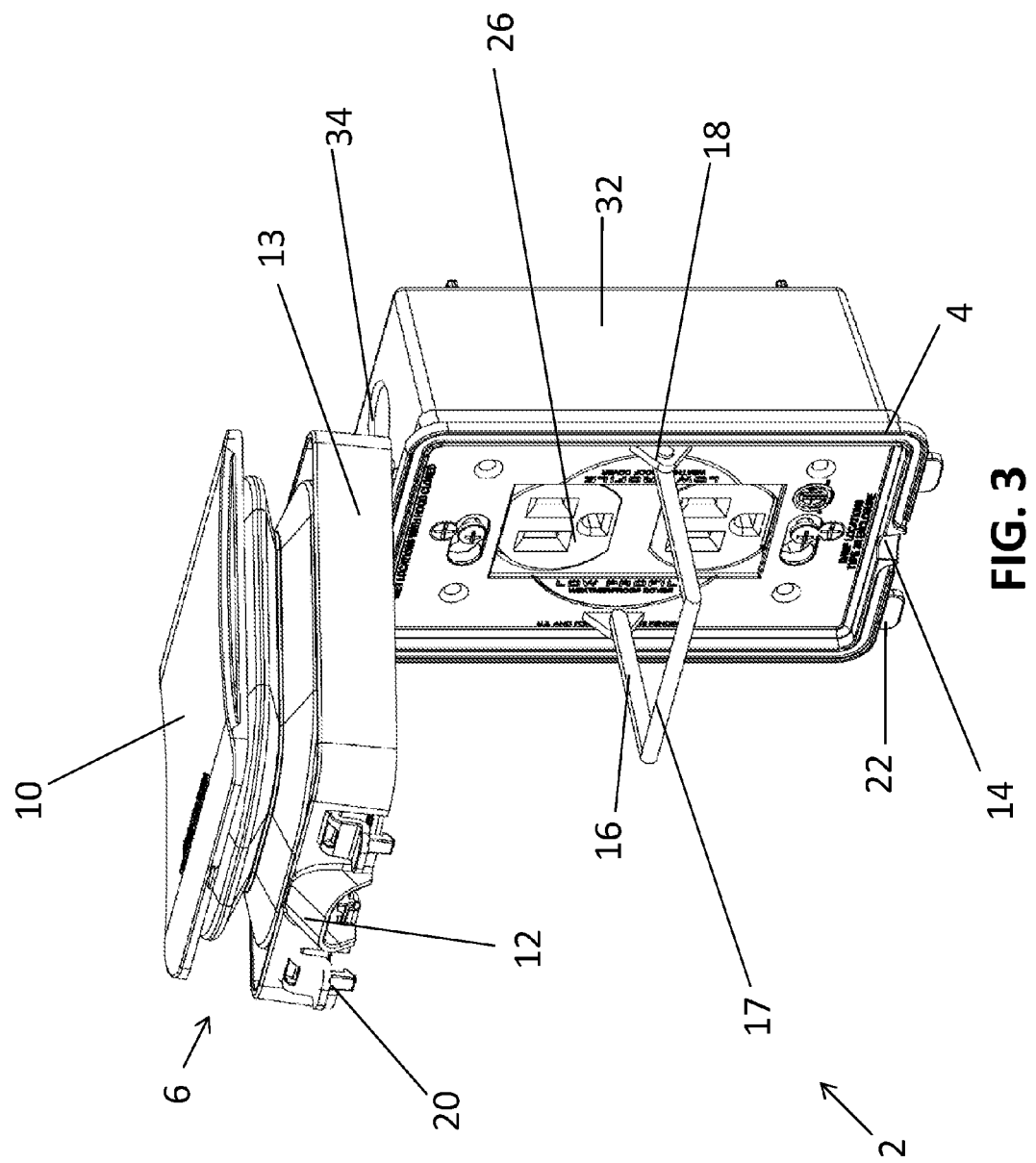
FIG. 3 is a perspective view of the electrical device cover assembly of FIG. 1 in an open, collapsed position.

FIG. 3 illustrates a first implementation of an electrical device cover assembly 2 with expansion arm 16 in a fully extended position with respect lid 6. It will be understood that expansion arm 16 may be adjusted to and maintained in a variety of extended positions. In particular implementations, expansion arm 16 may be maintained in position via a ratcheting mechanism, detenting mechanism, or other mechanism known in the art configured to allow the reversibly fixable positioning of expansion arm 16 with respect to lid 6.

Figure 4:
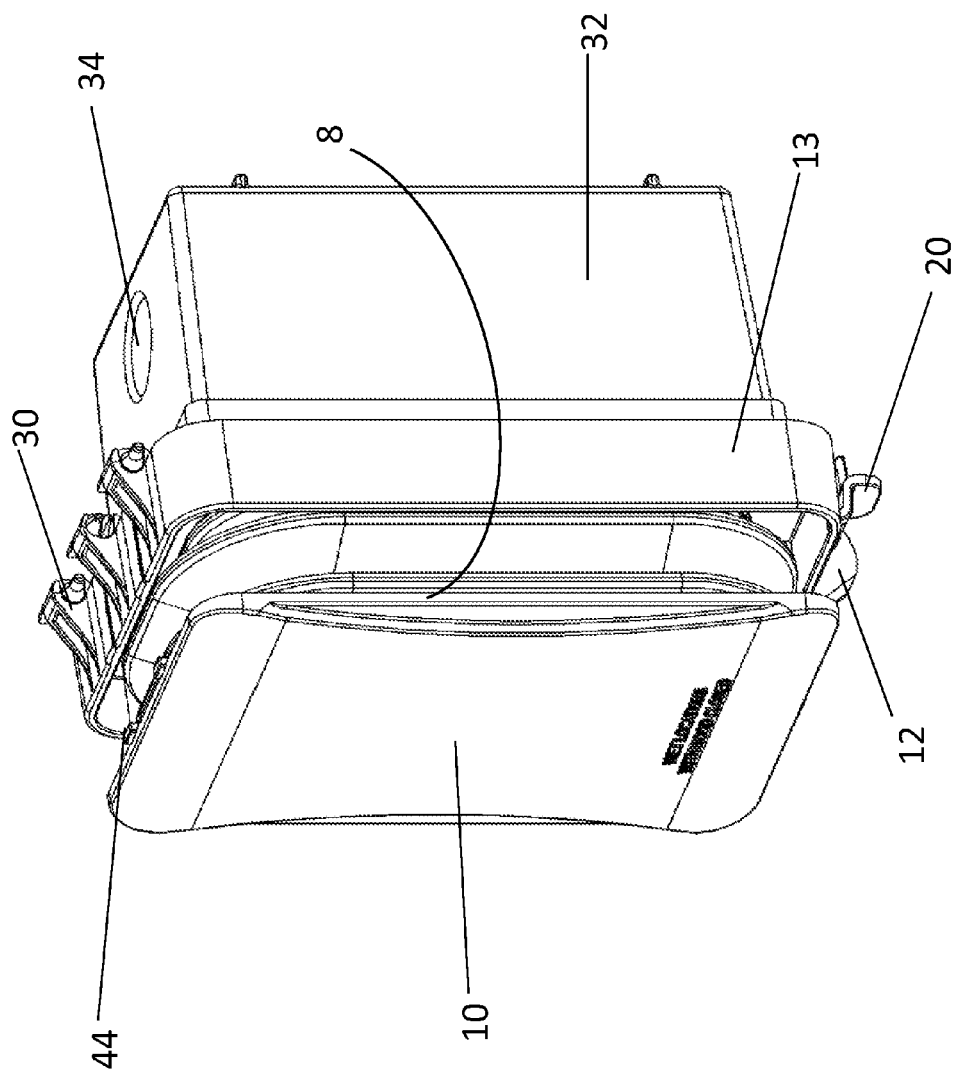
FIG. 4 is a perspective view of the electrical device cover assembly of FIG. 1 in a closed, partially expanded position.
Figure 5:
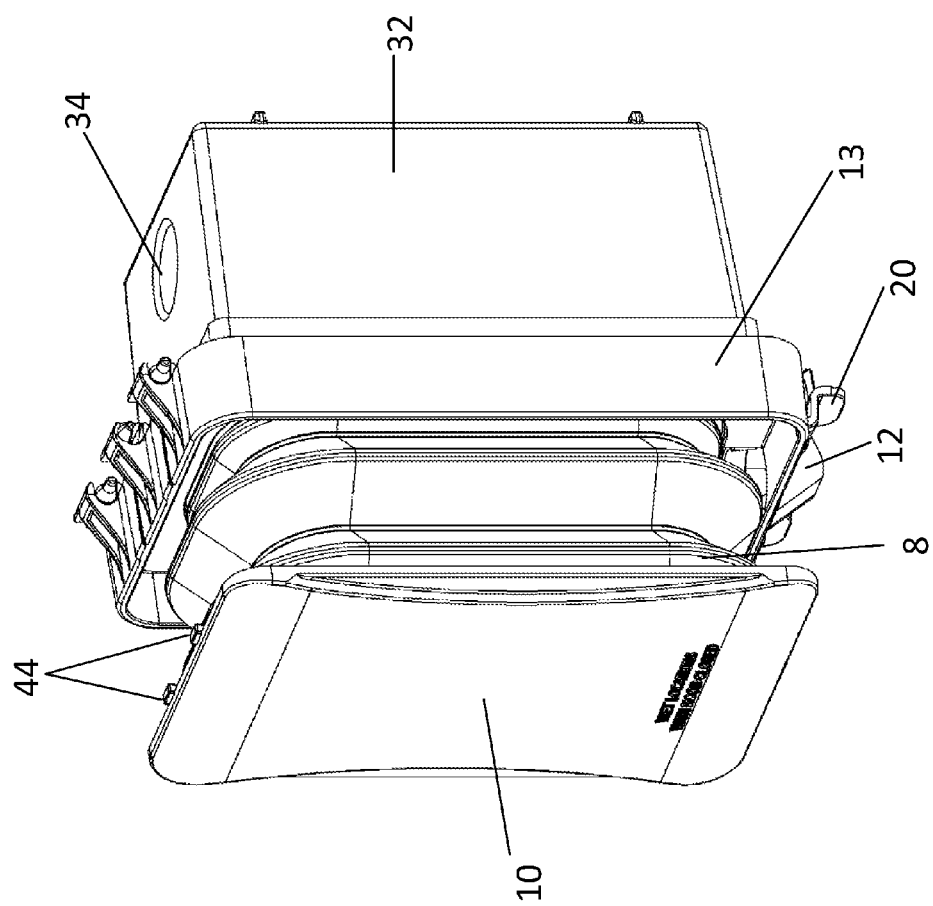
FIG. 5 is a perspective view of the electrical device cover assembly of FIG. 1 in a closed, fully expanded position.

FIGS. 4 and 5 illustrate a partially expanded position and a fully expanded position, respectively, of a first implementation of an electrical device cover assembly 2. Expansion section 8 is incrementally expandable from a partially expanded position (or even unexpanded position 40) to fully expanded position 42. In addition, in particular implementations, lid face 10 may comprise one or more snap tabs 44, which are configured to removably snap in-place lid face 10 with respect to lid ring 13.

Figure 6:
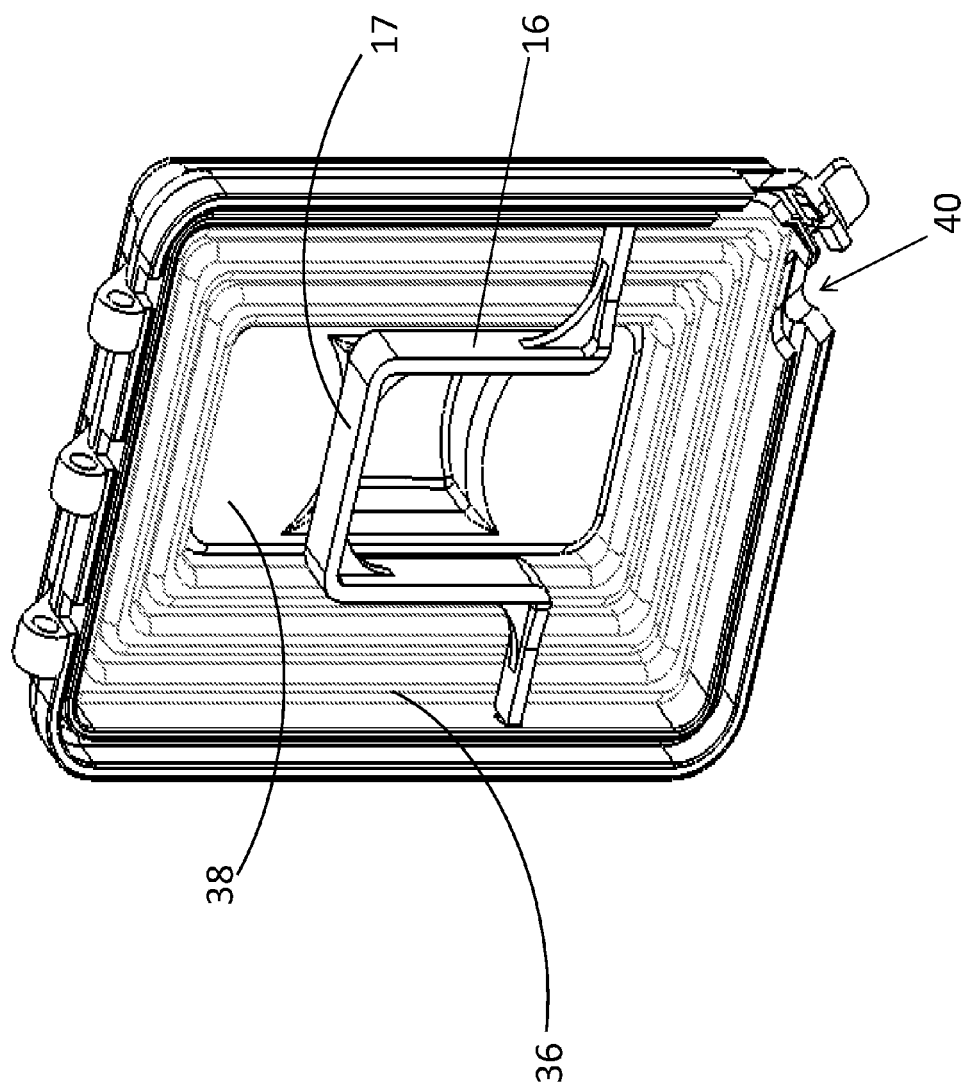
FIG. 6 is a rear perspective view of a second implementation of an electrical device cover assembly in a collapsed position.
Figure 7:
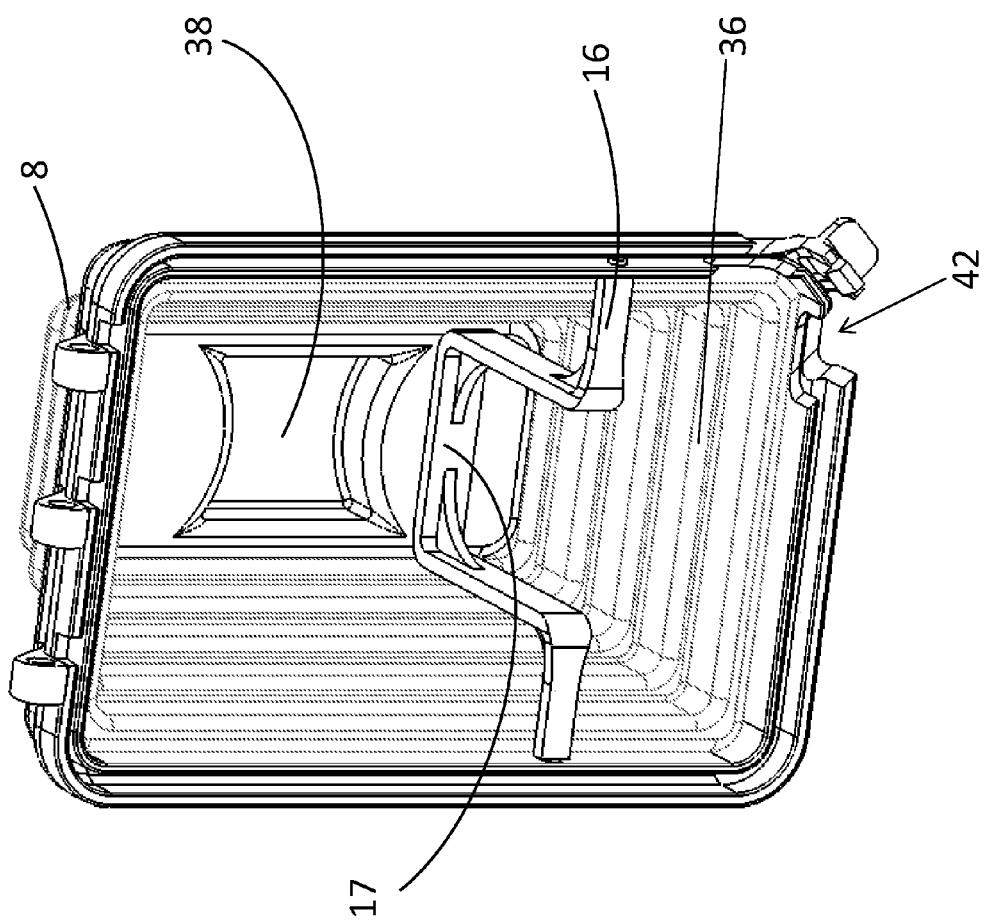
FIG. 7 is a rear perspective view of a second implementation of an electrical device cover assembly in an expanded position.

FIGS. 6 and 7 illustrate inside surface 38 of lid face 10, as well as inside surface 36 of expansion section 8 of a second implementation of electrical device cover assembly 2. A comparison of FIG. 3 to FIG. 4 shows that expansion section 8 is incrementally expandable from a first depth comprising unexpanded position 40, to a second depth comprising fully expanded position 42. In particular implementations, fully expanded position 42 (or a partially expanded position) may be achieved when inside surface 38 of lid face 10 is in contact with, and supported by, expansion arm 16 (via supporting edge 17). In other particular implementations, fully expanded position 42 (or a partially expanded position) may be achieved even when inside surface 38 of lid face 10 is not in contact with, or supported by, expansion arm 16.

In addition, in particular implementations, when expansion section 8 is in the fully expanded position 42, the depth of expansion section 8 is at least twice as deep as when the expansion section 8 is in the collapsed position 40.

Figure 8:
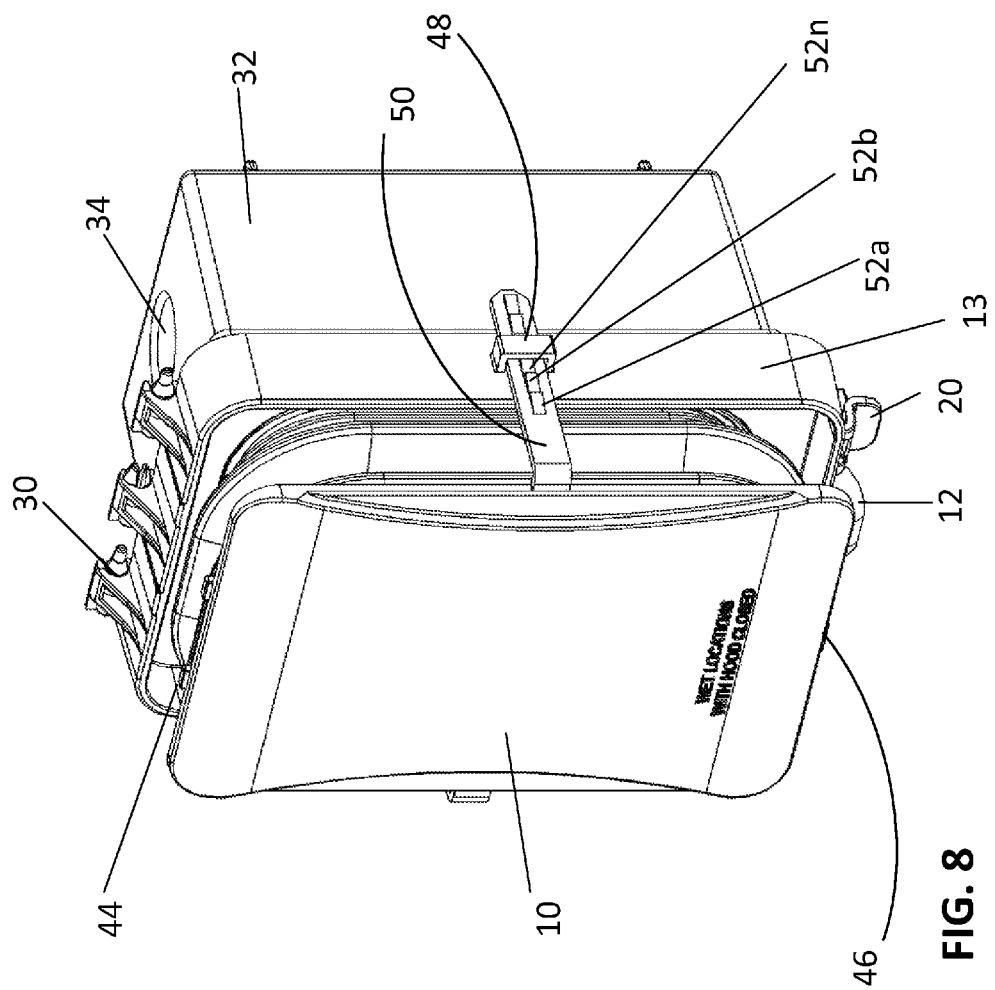
FIG. 8 is a perspective view of a third implementation of an electrical device cover assembly in a closed, fully expanded position.
Figure 9:
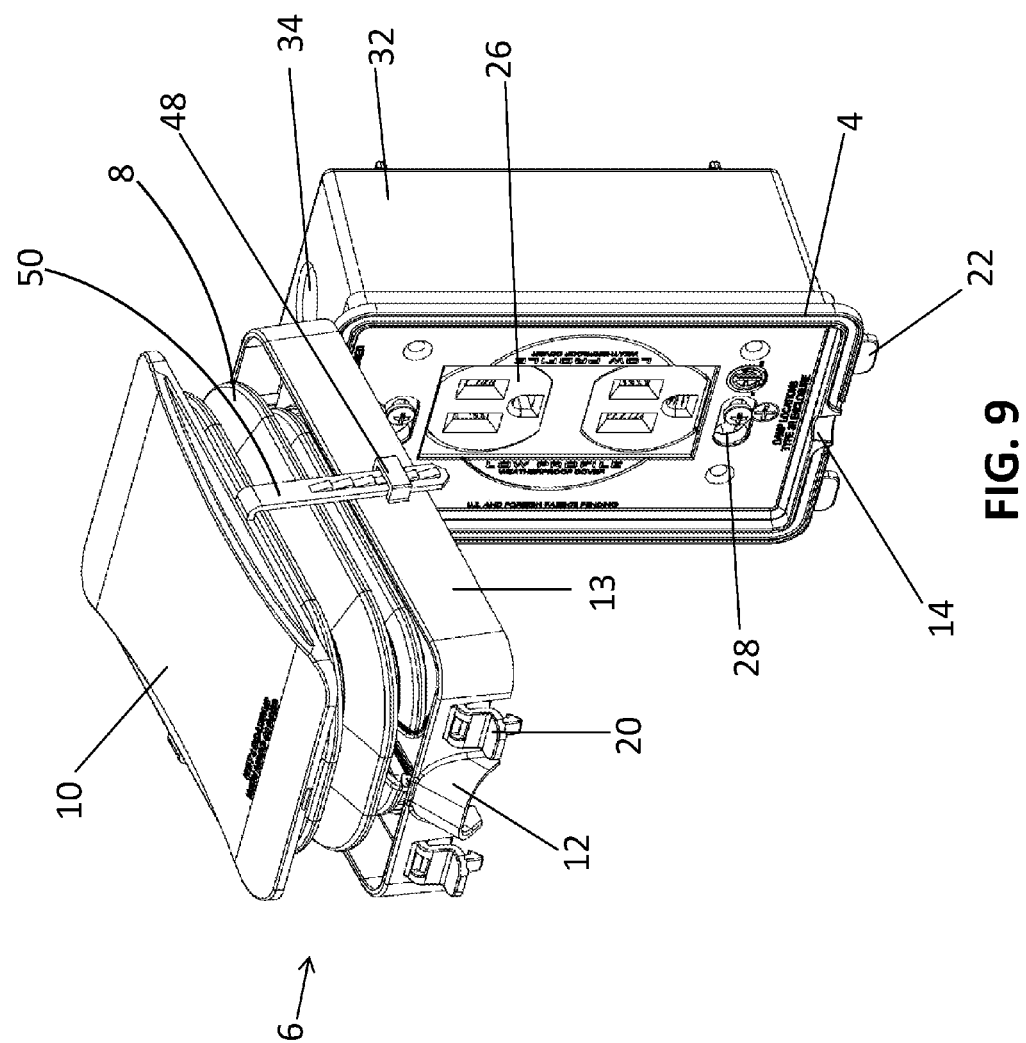
FIG. 9 is a perspective view of a third implementation of an electrical device cover assembly in an open, fully expanded position.

FIGS. 8-9 illustrate an implementation of an electrical device cover assembly 6. Lid face 10 is coupled with lid ring 13 via expansion section 8. Lid face 10 comprises one or more expansion arms 50 which comprise one or more ramped portions 52. In particular implementations, the one or more expansion arms 50 may comprise one or more levered pins. In other particular implementations, the one or more expansion arms 50 may be movably coupled with lid face 10. In still other implementations, the one or more expansion arms 50 may be movably coupled with lid ring 13.

Lid ring 13 comprises one or more eyelets 48 which are configured to engage with the one or more expansion arms 50 (via the one or more ramped portions 52), which may maintain lid face 10 at an expanded position with respect to lid ring 13. It will be understood that the spacing and configuration of the one or more ramped portions 52a, 52b, 52n comprising the one or more levered pins 50 allow for the lid face 10 to be supported at a plurality of expanded positions (incremental expansion points), the incremental expansion points corresponding with the particular ramped portion that is engaged with the eyelet 48. In particular, it will be understood that when levered pin 50 comprising ramped portion 52n is engaged with eyelet 48, the incremental expansion point of lid 10 is greater than when ramped portion 52a is engaged with eyelet 48. In any event, it will be understood that the number of incremental expansion points may correspond to the number of points at which the one or more eyelets 48 may engage the one or more levered pins, which may correspond to the number of ramped portions 52 provided.

Still referring to the third implementation of an electrical device cover assembly 6 illustrated in FIGS. 8-9, lid ring 13 may comprise one or more lid hinge elements 30 which hingeably couple main ring 7 with base 4 (FIG. 9). Referring specifically to FIG. 9, base 4 may comprise one or more tabs 22 which may engage with one or more lid clasps 20 comprising main ring 7 in order to provide a removably locking fit between main ring 7 and base 4. With lid ring 13 in a closed position with respect to base 4 (whether or not the one or more tabs 22 are engaged with the one or more lid clasps 20), lid cord port 12 and base cord port 14 may together comprise an opening through which an electrical device cord may pass while in-use.

Figure 10:
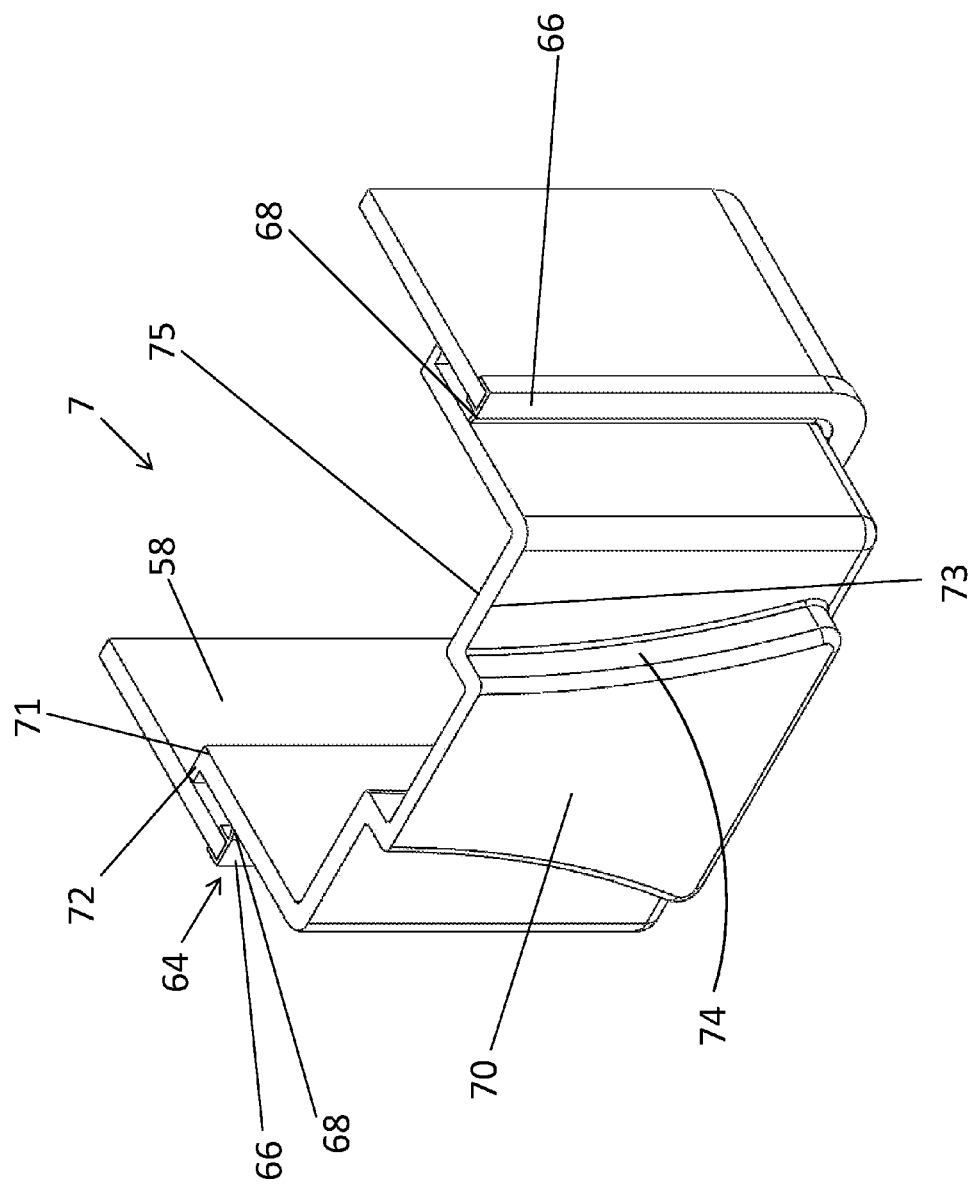
FIG. 10 is a cut-away view of a fourth implementation of an electrical device cover assembly in a collapsed position.
Figure 11:
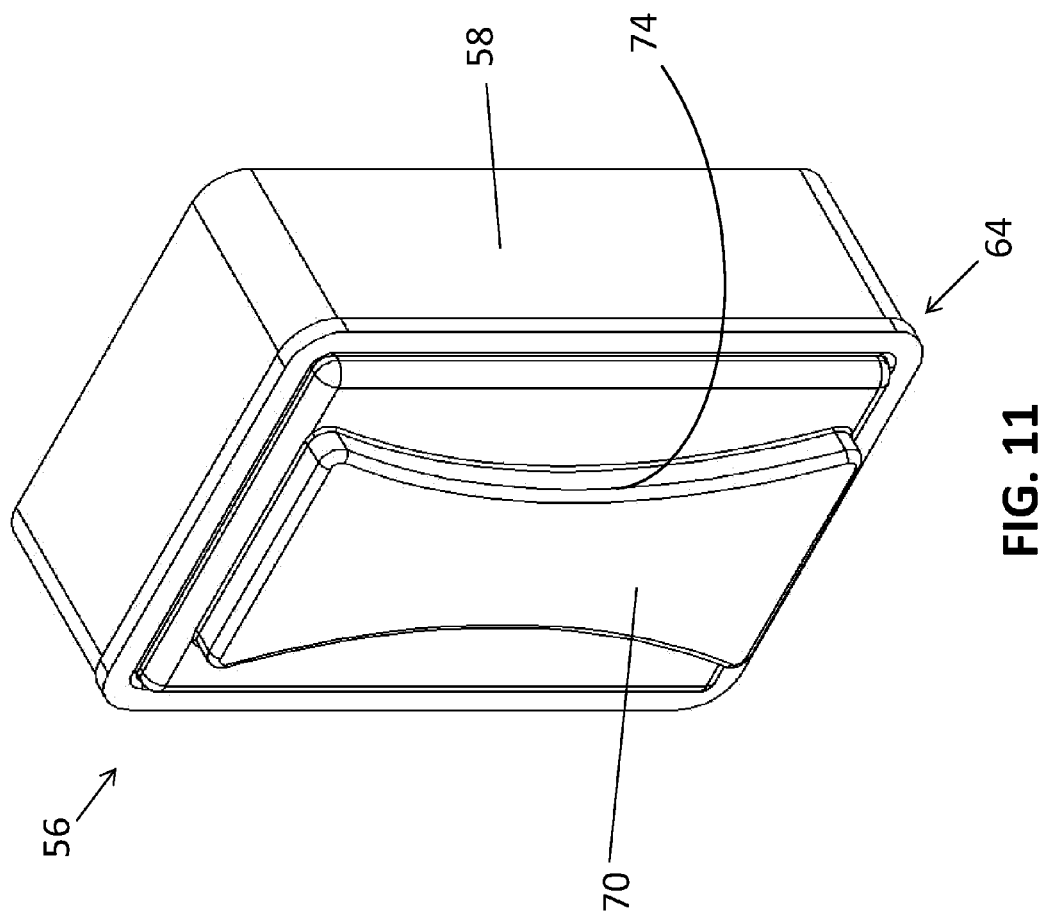
FIG. 11 is a front perspective view of the electrical device cover assembly of FIG. 10 in a collapsed position.
Figure 12:
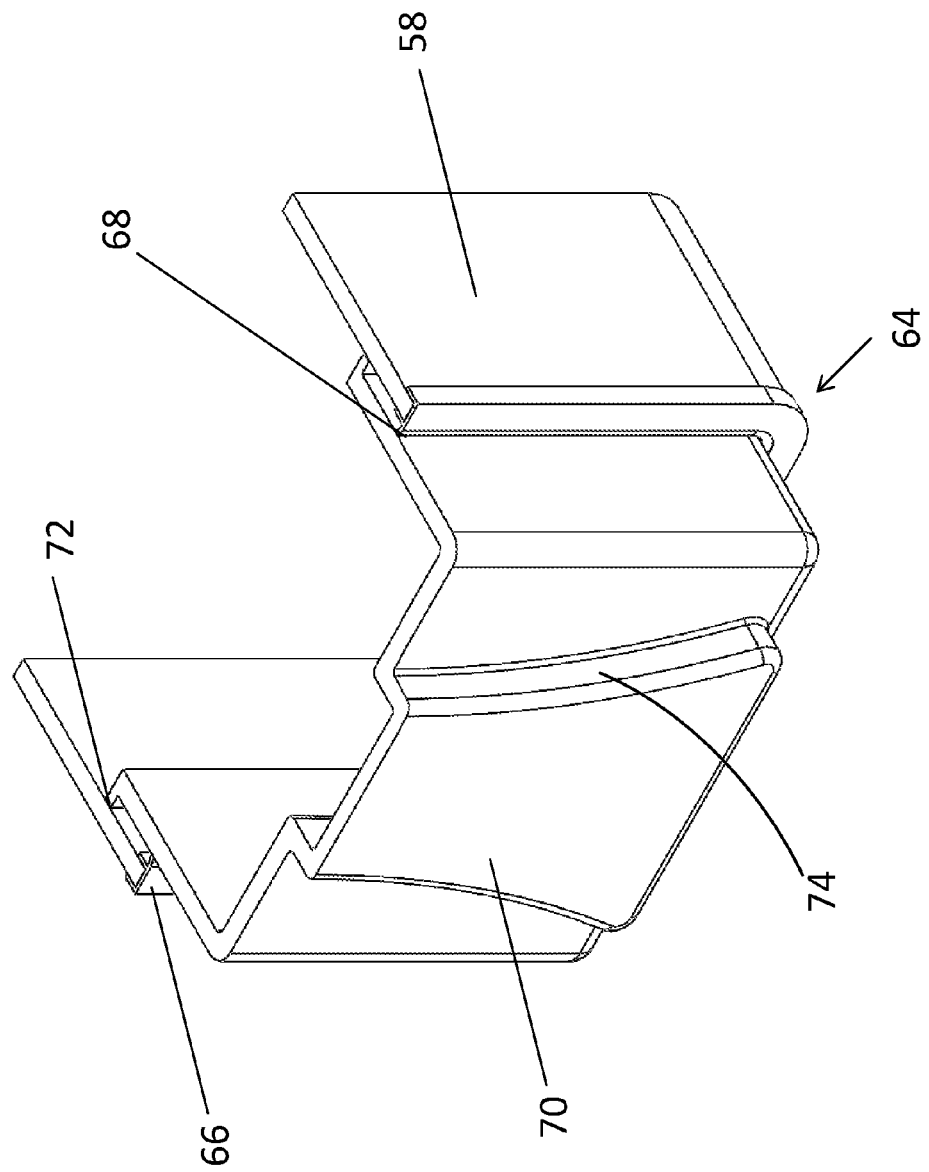
FIG. 12 is a cut-away view of the electrical device cover assembly of FIG. 10 in a partially expanded position.
Figure 13:
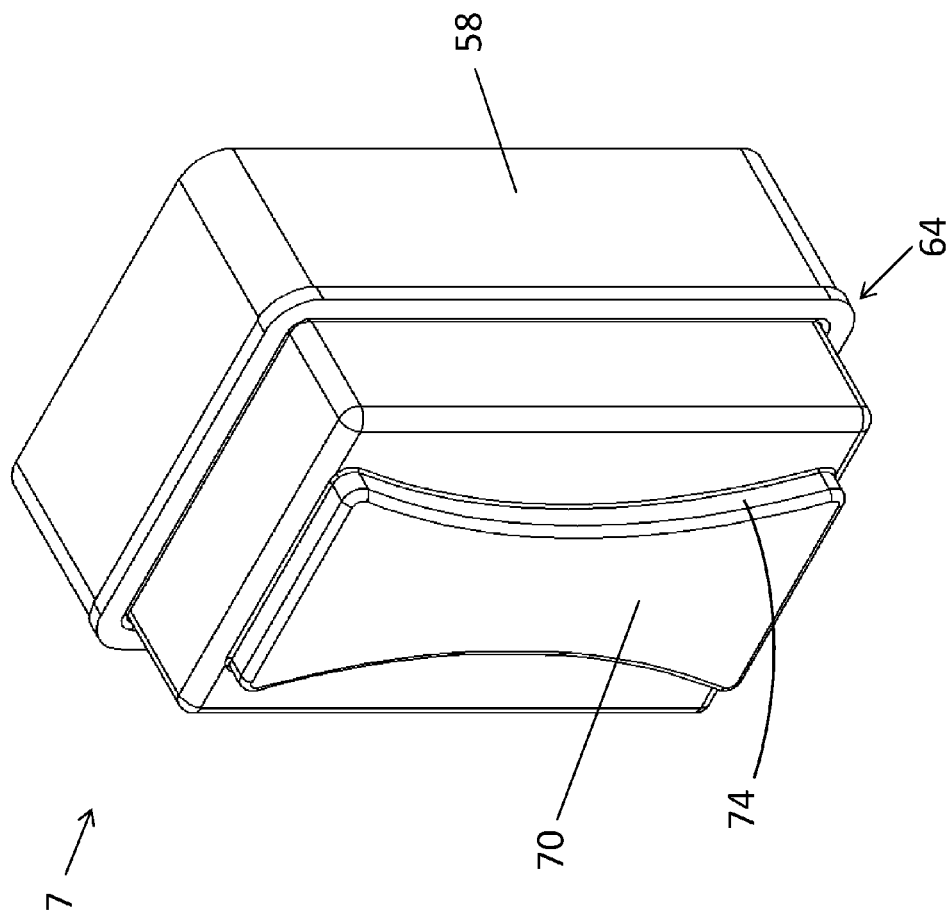
FIG. 13 is a perspective view of the electrical device cover assembly of FIG. 10 in a fully expanded position.

FIGS. 10 and 11 illustrate another implementation of an electrical device cover assembly 7 in an unexpanded position, while FIGS. 12 and 13 illustrate the implementation of an electrical device cover assembly 7 in partially expanded and fully-expanded positions, respectively. Electrical device cover assembly 7 comprises lid ring 58 and lid face 70. Lid face 70 comprises outer surface 73 (which may comprise one or more finger recesses 74 to aid in grasping), inner surface 75, and trailing edge 71, which comprises protrusion 72. An expandable section of the lid face 70 extends between the outer surface 73 and the trailing edge 71. A wiper gasket 64 is provided, which is configured to resist water entry between lid ring 58 and lid face 70. In particular, wiper gasket 64 comprises wiper gasket base portion 66 (which is coupled with the base 58) and wiper blade element 68. Wiper blade element 68 projects from wiper gasket base portion 66 and contacts with outer surface 73 of lid 70, providing a flexible barrier to resist water entry between base 58 and lid 70, whether lid 70 is an expanded, or unexpanded, position with respect to base 58. In addition, it will be understood that when lid face 70 is collapsed with respect to lid ring 58, wiper blade element 68 acts as a "squeegee," wiping surface moisture from outer surface 73 of lid face 70 as lid face 70 is moved towards a collapsed position. As can be seen from a comparison of FIG. 10 to FIGS. 12 and 13, wiper element 68 may remain in contact with outer surface 73 of lid face 70, whether lid face 70 is maintained in an unexpanded position, a partially expanded position, or a fully expanded position. In addition, the flexible nature of wiper element 68 allows wiper element 68 to remain in contact with outer surface 73 of lid face 70, whether lid face 70 is being expanded or collapsed with respect to lid ring 58.

Figure 14:
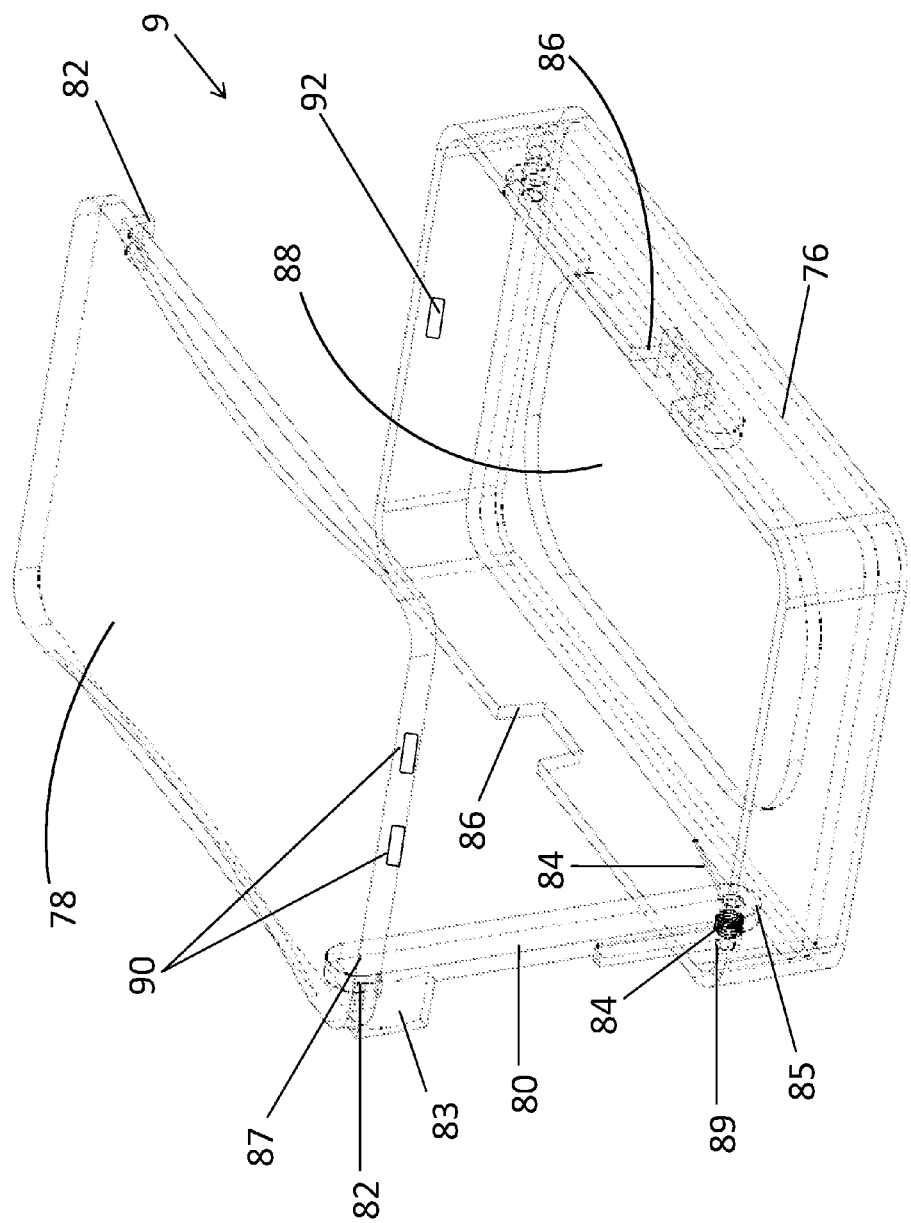
FIG. 14 is a perspective view of a fifth implementation of an electrical device cover assembly in a fully expanded position.
Figure 15:
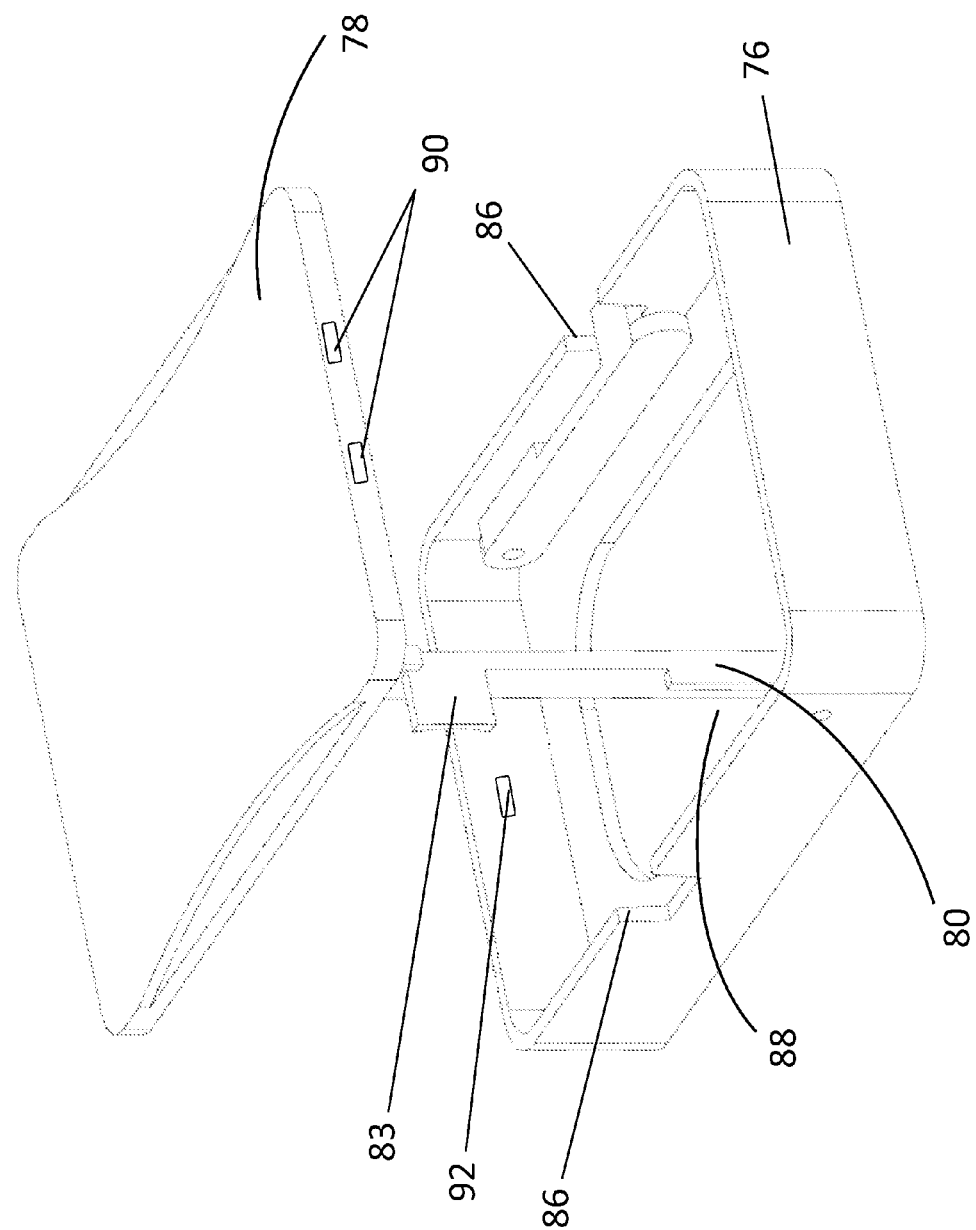
FIG. 15 is a perspective view of a lid expansion arm comprising the electrical device cover assembly of FIG. 14.

FIGS. 14-15 illustrate various views of yet another implementation of an electrical device cover assembly 9. Electrical device cover assembly 9 comprises at least base 76 and lid 78. Electrical device cover assembly 9 comprises at least one electrical device opening 88, one or more expansion arm tab cutouts 86, and one or more expansion arm axels 89. In particular implementations, base 76 comprises at least one opening 88 into the lid, one or more expansion arm tab cutouts 86, and one or more expansion arm axels 89. Lid 78 comprises at least one expansion arm stop 82. Base 76 is coupled with lid 78 via an expansion section (not shown for clarity of illustration). The base would, of course, include at least one cord port. In addition, a first end 85 of expansion arm 80 is biasedly and pivotably coupled with base 76 via one or more lid expansion arm axels 89 (which may comprise spring element 84). Expansion arm 80 is pivotable between a first position (parallel to base 76 in this implementation) and a second position (perpendicular to base 76 in this implementation). It will be understood that for this particular implementation, when expansion arm 80 is in the second position, the second end 87 of expansion arm 80 is in contact with the one or more lid expansion arm stops 82, thereby supporting lid 78 in an open position with respect to base 76. A user desiring to move expansion arm 80 from its second position to its first position may grasp expansion arm tab 83 and thereafter move expansion arm 80 to its first position (where expansion arm tab 83 may reside in the one or more expansion arm tab cutouts 86. Likewise, a lid 78 may comprise one or more snap tabs 90 and one or more lower snap tabs (not shown), which are both configured to removably snap in-place lid 78 with respect to base 76 (by snappably mating with one or more snap tab notches 92).

Figure 16:
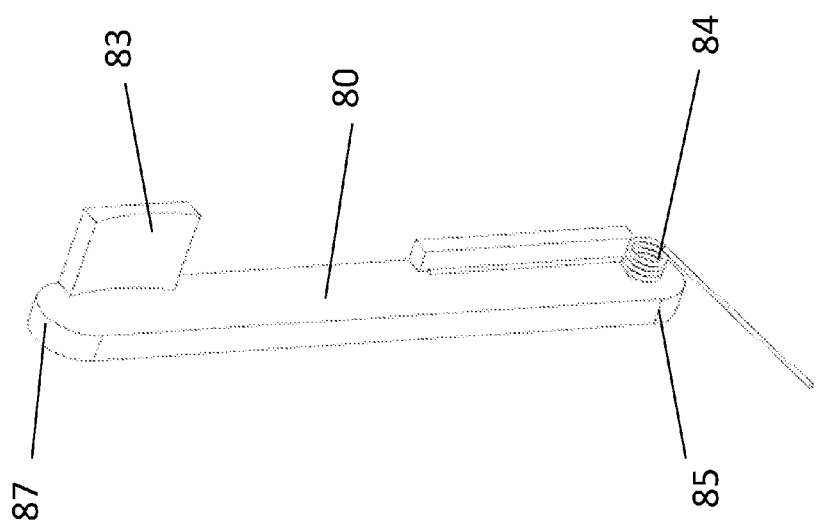
FIG. 16 is a perspective view of a sixth implementation of an electrical device cover assembly in a fully expanded position.
Figure 17:
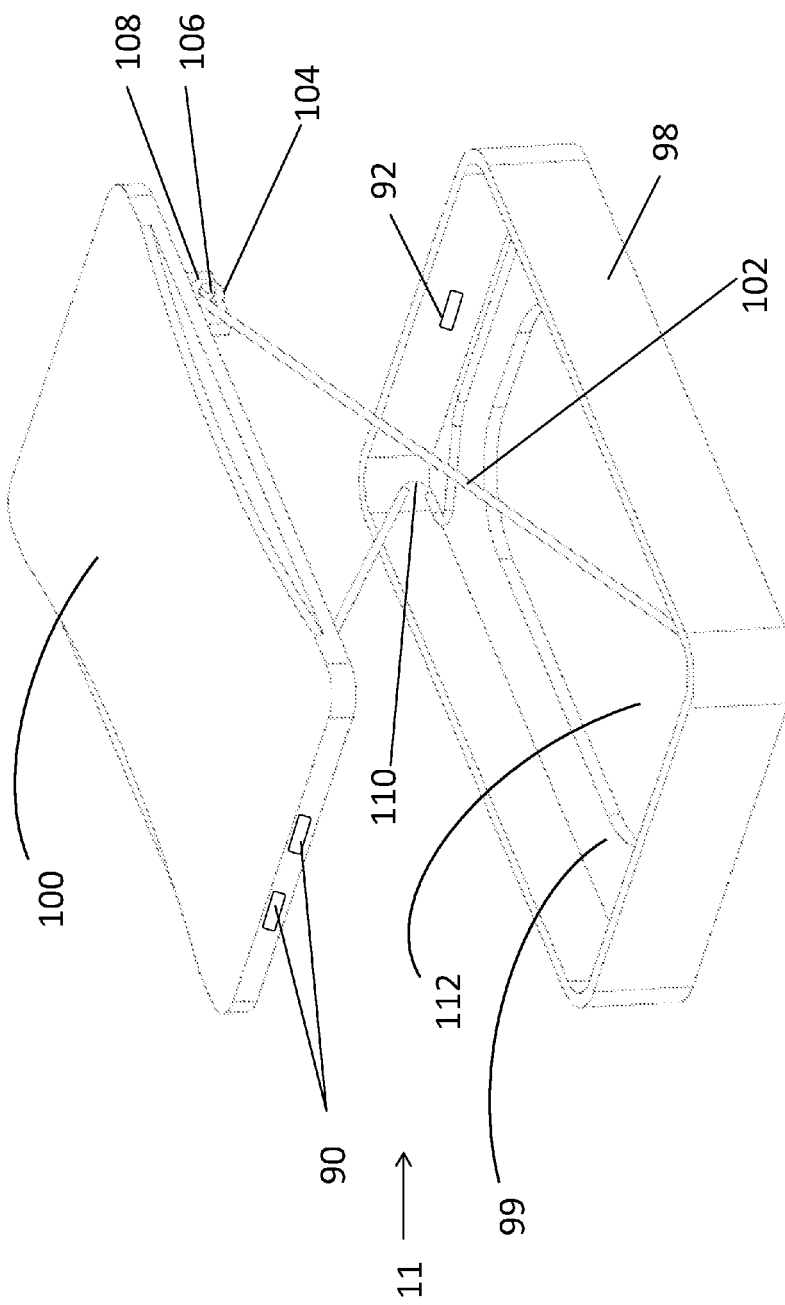
FIG. 17 is a bottom perspective view of the electrical device cover assembly of FIG. 16 in a fully expanded position.
Figure 18:
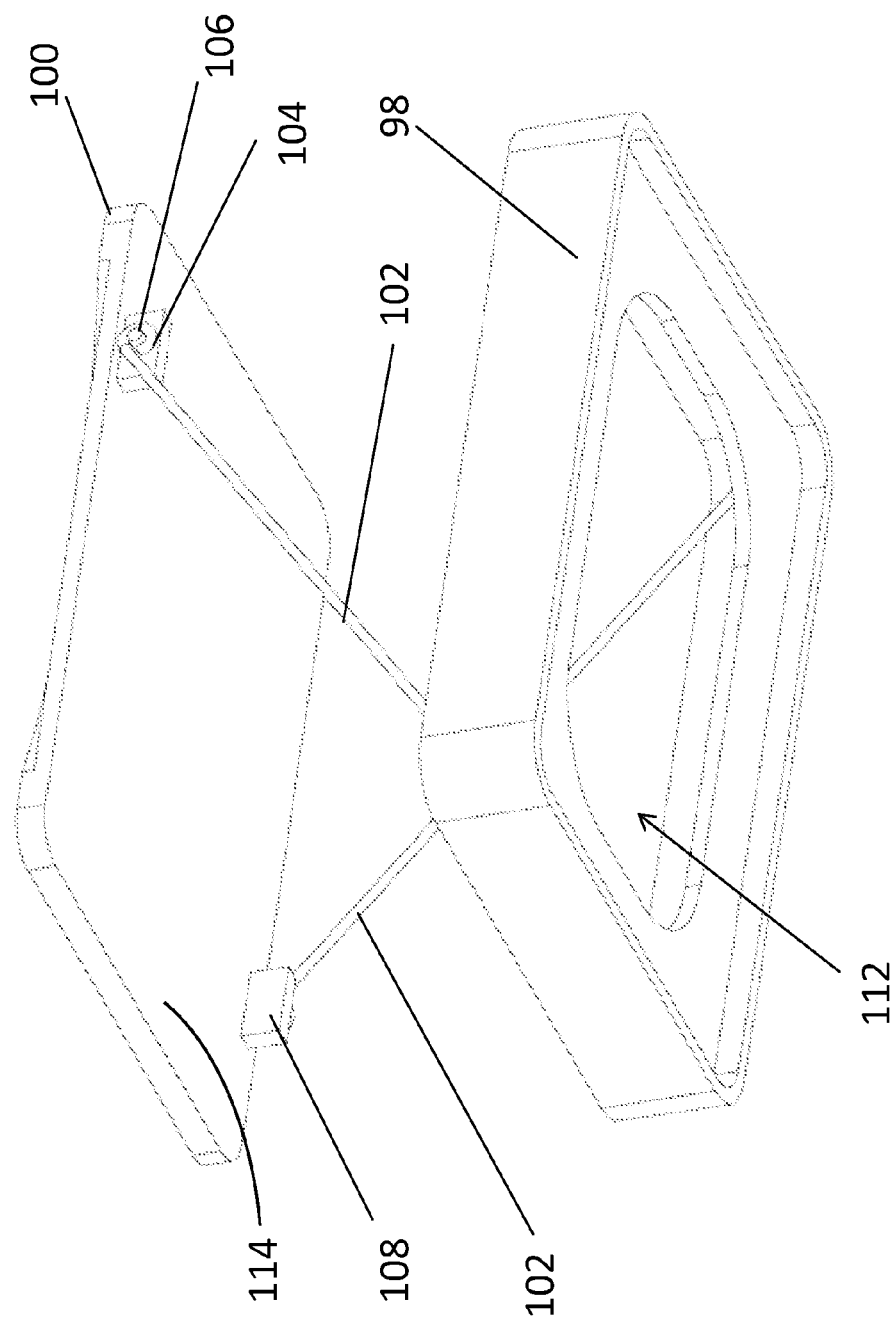
FIG. 18 is a perspective view of a lid expansion arm comprising the electrical device cover assembly of FIG. 17.

FIGS. 16-18 illustrate various views of still yet another implementation of an electrical device cover assembly 11. Electrical device cover assembly 11 comprises at least lid ring 98 and lid face 100. Lid ring 98 comprises at least one opening 112 into the lid and a recessed perimeter 99. Lid face 100 comprises one or more lid axel nubs 106. Lid ring 98 is coupled with lid 78 via an expansion section (not shown for clarity of illustration). In particular implementations, and as shown, expansion arm 102 may comprise a spring steel element, or other element configured to bias open lid face 100 with respect to lid ring 98. In other particular implementations, at least a portion of expansion arm 102 is maintained in communication with recessed perimeter 99 comprising lid ring 98. In addition, in particular implementations, one or more distal ends 104 comprising lid expansion arm 102 are coupled with lid face 100 via one or more lid expansion arm axel nubs 106. In the particular implementation shown, lid expansion arm 102 is flex-able between a first position (substantially parallel to lid ring 98 in this implementation) and a second position (oblique to base 76 in this implementation). It will be understood that in this particular implementation as lid expansion arm 102 flexes between its first and second positions, one or more spring joints 110 (FIG. 22) will flex. It will be further understood that as lid expansion arm 102 flexes between its first and second positions, one or more distal ends 104 comprising lid expansion arm 102 pivot with respect to the one or more lid axel nubs 106. When lid expansion arm 102 is in the second position, lid face 100 is supported in an open position with respect to lid ring 98. A user desiring to move lid expansion arm 102 from its second position to its first position may grasp and move lid face 100 toward lid ring 98. A user may thereafter snappably couple lid face 100 with lid ring 98 by snappably mating one or more nap tabs 90 comprising lid face 100 with one or more snap tab notches 92 on lid ring 98. In addition, it will be understood that lid ring 98 may comprise one or more hinge elements (hidden in FIGS. 14-15, but similar to that shown in FIG. 2) which are configured to hingeably couple lid ring 98 with respect to a base (as shown in FIG. 2, which illustrates a lid ring coupled to a base in a different particular implementation).

Figure 19:
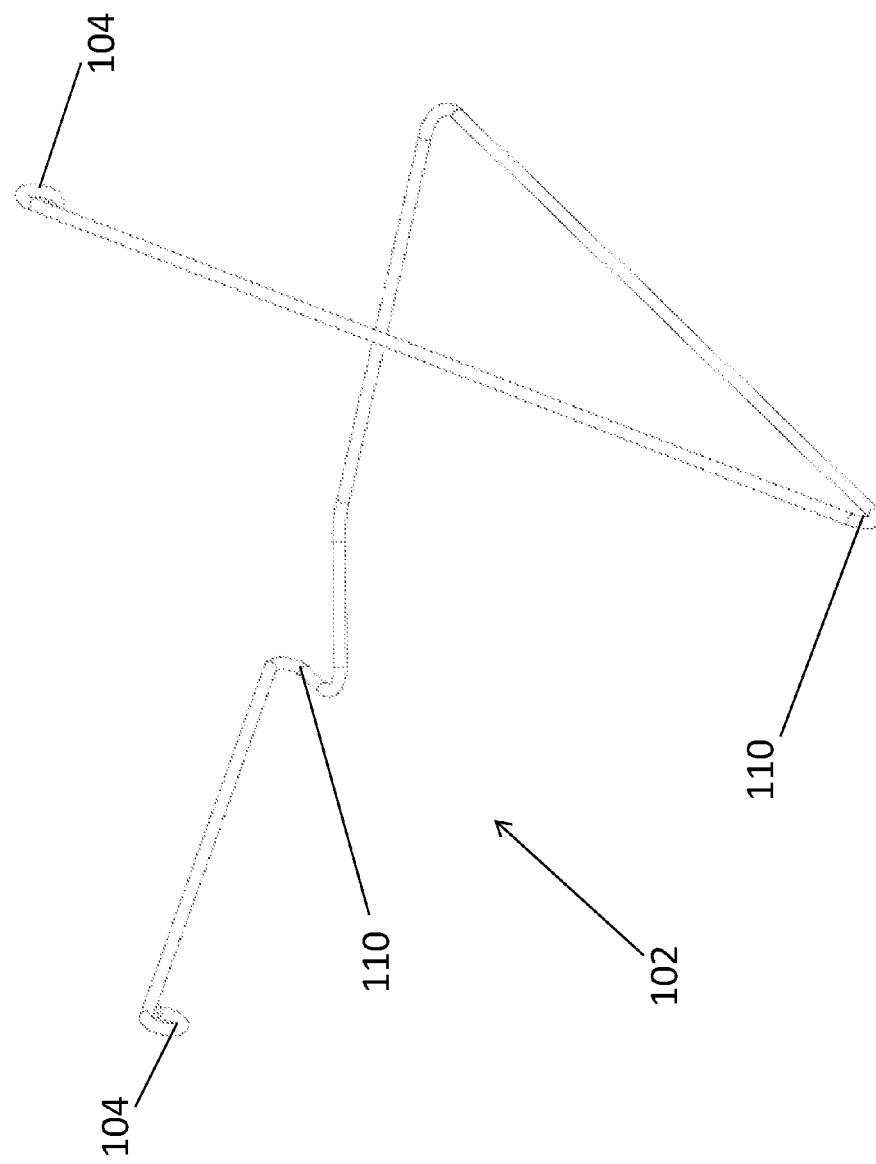
FIG. 19 is a perspective view of a seventh implementation of an electrical device cover assembly in a fully expanded position.
Figure 20:
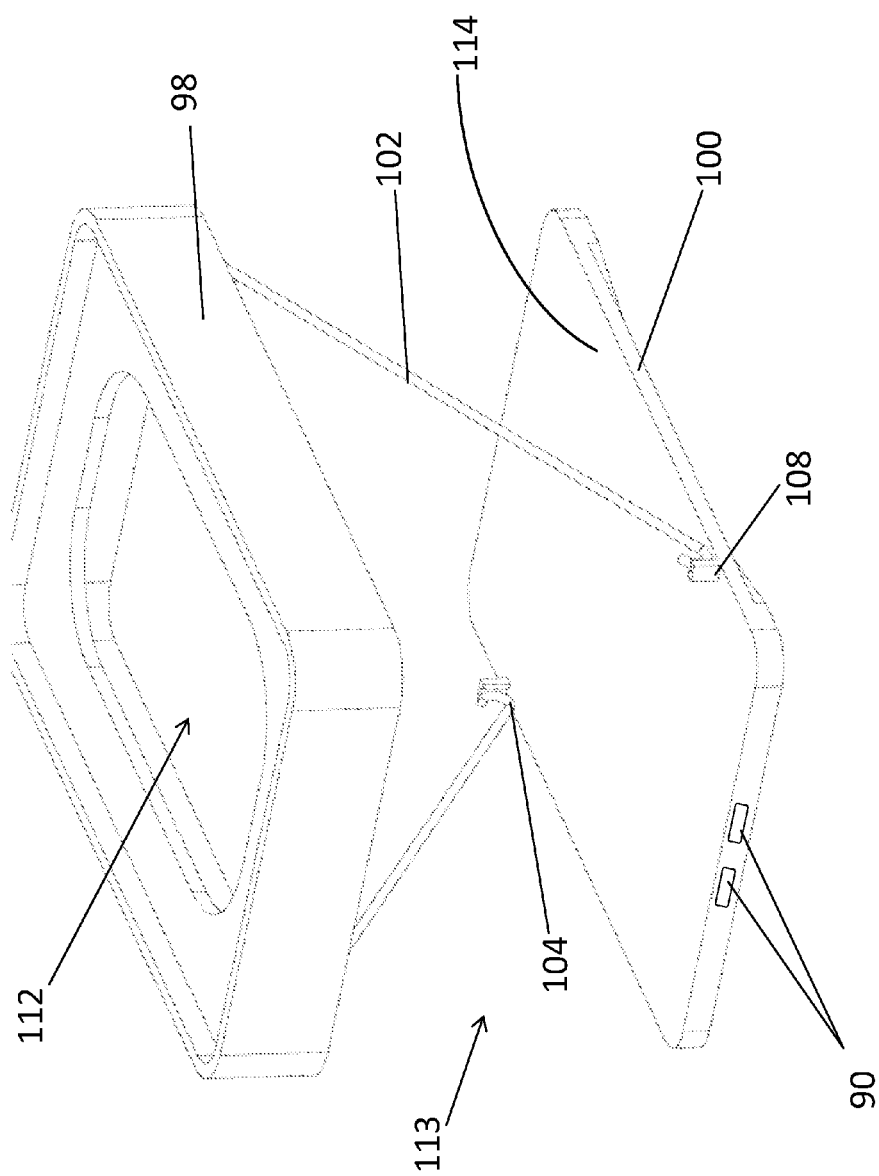
FIG. 20 is a top perspective view of a lid comprising the electrical device cover of FIG. 19.

FIGS. 19 and 20 illustrate various views of still another implementation of an electrical device cover assembly 13. Electrical device cover assembly 13 comprises at least base 98 and lid face 100. Lid ring 98 comprises at least one electrical device opening 112 and a recessed perimeter 99 (obscured in this view). Lid face 100 comprises one or more lid expansion arm stops 108. Lid ring 98 is coupled with lid face 100 via an expansion section (not shown for clarity of illustration). In the particular implementation shown, at least a portion of expansion arm 102 is maintained in communication with recessed perimeter 99 of lid ring 98. In addition, in the particular implementations shown, one or more distal ends 104 of lid expansion arm 102 is in contact with the one or more lid expansion arm stops 108, thereby supporting lid face 100 when in an open position with respect to base 98. In the particular implementation shown, lid expansion arm 102 is flex-able between a first position (substantially parallel to lid ring 98 in this implementation) and a second position (oblique to base 76 in this implementation). It will be understood that in this particular implementation as lid expansion arm 102 flexes between its first and second positions, one or more spring joints 110 (FIG. 19) will flex. It will be further understood that as lid expansion arm 102 flexes between its first and second positions, one or more distal ends 104 comprising lid expansion arm 102 pivot with respect to the one or more lid expansion arm stops 108. When lid expansion arm 102 is in the second position, lid face 100 is supported in an open position with respect to lid ring 98. A user desiring to move lid expansion arm 102 from its second position to its first position may grasp and move lid face 100 toward lid ring 98. A user may thereafter snappably couple lid face 100 with lid ring 98 by snappably mating one or more nap tabs 90 comprising lid face 100 with one or more snap tab notches 92 on lid ring 98. In addition, it will be understood that lid ring 98 may comprise one or more hinge elements (hidden in FIGS. 14-15, but similar to that shown in FIG. 2) which are configured to hingeably couple lid ring 98 with respect to a base (as shown in FIG. 2, which illustrates a lid ring coupled to a base in a different particular implementation).

It will be understood by those of ordinary skill in the art that the concepts of using pivoting arms, levered pins and eyelets, snap tabs, wiper gaskets, and lid extension bars to maintain an electrical device cover lid in an open position with respect to a base, as disclosed herein, is not limited to outdoor covers or to the specific implementations shown herein. For example, it is specifically contemplated that the components included in a particular implementation of an electrical device cover may be formed of any of many different types of materials or combinations that can readily be formed into shaped objects and that are consistent with the intended operation of an electrical device cover. For example, the components may be formed of: rubbers (synthetic and/or natural) and/or other like materials; polymers and/or other like materials; plastics, and/ or other like materials; composites and/or other like materials; metals and/or other like materials; alloys and/or other like materials; and/or any combination of the foregoing.

Furthermore, the bases, lids, covers, and any other components forming a particular implementation of an electrical device cover may be manufactured separately and then assembled together, or any or all of the components may be manufactured simultaneously and integrally joined with one another. Manufacture of these components separately or simultaneously may involve extrusion, pultrusion, vacuum forming, injection molding, blow molding, resin transfer molding, casting, forging, cold rolling, milling, drilling, reaming, turning, grinding, stamping, cutting, bending, welding, soldering, hardening, riveting, punching, plating, and/or the like. If any of the components are manufactured separately, they may then be coupled or removably coupled with one another in any manner, such as with adhesive, a weld, a fastener, any combination thereof, and/or the like for example, depending on, among other considerations, the particular material(s) forming the components.

It will be understood that particular implementations are not limited to the specific components disclosed herein, as virtually any components consistent with the intended operation of a method and/or system implementation for an electrical device cover may be utilized. Accordingly, for example, although particular bases, lids, and cord ports may be disclosed, such components may comprise any shape, size, style, type, model, version, class, grade, measurement, concentration, material, weight, quantity, and/or the like consistent with the intended operation of a method and/or system implementation for an electrical device cover may be used.

In places where the description above refers to particular implementations of an electrical device cover, it should be readily apparent that a number of modifications may be made without departing from the spirit thereof and that these implementations may be applied to other electrical device covers. The accompanying claims are intended to cover such modifications as would fall within the true spirit and scope of the disclosure set forth in this document. The presently disclosed implementations are, therefore, to be considered in all respects as illustrative and not restrictive, the scope of the disclosure being indicated by the appended claims rather than the foregoing description. All changes that come within the meaning of and range of equivalency of the claims are intended to be embraced therein.

The invention claimed is:

1. An electrical device cover assembly configured for mounting over an electrical device, the electrical device cover assembly comprising:
   a base comprising an opening large enough to receive an electrical device;
   a lid comprising a lid ring and a lid face moveably coupled to the lid ring and expandable from a collapsed position having a first depth to an expanded position having a second depth deeper than the first depth; and
   one or more wiper gaskets coupled to the lid and extending between the lid ring and the lid face, the one or more wiper gaskets maintaining sliding contact between the lid ring and the lid face when the lid is moved from its collapsed position to its expanded position, the one or more wiper gaskets configured to resist water entry between the lid ring and the lid face.

2. The electrical device cover of claim 1, wherein the one or more wiper gaskets are coupled to the lid ring.

3. The electrical device cover assembly of claim 1, wherein the one or more wiper gaskets comprises a wiper blade extending toward and in contact with the lid face when the lid is moved from its collapsed position to its expanded position.

4. The electrical device cover assembly of claim 1, wherein the one or more wiper gaskets comprise a wiper gasket base portion coupled with the base and a wiper blade extending toward said lid face.

5. The electrical device cover assembly of claim 4, wherein
   said lid ring has a side wall with an open front end defining an axial passage; and
   said lid face has an outer surface and a side wall received in said open front end of said lid ring for sliding in said axial passage of said lid ring, and where said lid face has a trailing edge with a protrusion extending outwardly engaging an inner face of said side wall of said lid ring.

6. An electrical device cover assembly configured for mounting over an electrical device, the electrical device cover assembly comprising: a base comprising an opening large enough to receive an electrical device; a lid comprising a lid ring and a lid face moveably coupled to the lid ring and expandable from a collapsed position having a first depth to an expanded position having a second depth deeper than the first depth, said lid face being slidably coupled to said lid ring; and one or more wiper gaskets coupled to the lid and extending between the lid ring and the lid face, the one or more wiper gaskets maintaining sliding contact between the lid ring and the lid face when the lid is moved from its collapsed position to its expanded position, the one or more wiper gaskets configured to resist water entry between the lid ring and the lid face.

7. The electrical device of claim 6, further comprising a sealing member between said lid ring and lid face.

8. The electrical device cover assembly of claim 6, wherein the one or more wiper gaskets comprise a wiper gasket base portion coupled with the lid ring and a wiper blade extending toward said lid face.

9. The electrical device cover assembly of claim 8, wherein
   said lid ring has a side wall with an open front end defining an axial passage; and
   said lid face has an outer surface and a side wall received in said open front end of said lid ring for sliding in said axial passage of said lid ring, and where said lid face has a trailing edge with a protrusion extending outwardly engaging an inner face of said side wall of said lid ring.

* * * * *